United States Patent [19]
Ruby et al.

[11] Patent Number: 5,792,280
[45] Date of Patent: Aug. 11, 1998

[54] METHOD FOR FABRICATING SILICON CELLS

[75] Inventors: Douglas S. Ruby; Paul A. Basore; W. Kent Schubert, all of Albuquerque, N. Mex.

[73] Assignee: Sandia Corporation, Albuquerque, N. Mex.

[21] Appl. No.: 820,969

[22] Filed: Dec. 27, 1996

Related U.S. Application Data

[63] Continuation of Ser. No. 239,624, May 9, 1994, abandoned.

[51] Int. Cl.$^6$ ............................................. H01L 31/00
[52] U.S. Cl. ...................... 136/258; 136/256; 136/261; 438/71; 438/73
[58] Field of Search .................... 136/256, 258 R, 136/261; 438/71, 73

[56] References Cited

U.S. PATENT DOCUMENTS

| | | | |
|---|---|---|---|
| 3,808,060 | 4/1974 | Hays et al. | 437/156 |
| 4,101,351 | 7/1978 | Shah et al. | 437/2 |
| 4,251,285 | 2/1981 | Yoldas et al. | 136/256 |
| 4,589,191 | 5/1986 | Green et al. | 437/2 |
| 5,258,077 | 11/1993 | Shahryar | 136/256 |

FOREIGN PATENT DOCUMENTS

| | | | |
|---|---|---|---|
| 1-245515 | 9/1989 | Japan | 437/164 |
| 3-185821 | 8/1991 | Japan | 437/164 |

OTHER PUBLICATIONS

M A Green et al, "25% Efficient Low–Resistivity Si Concentrator Solar Cells", pp. 583–585, *IEEE Electron Device Letters*, Oct. 1986.

D. B. Bickler et al, *Conference Record, 19th IEEE Photovoltaic Specialists Conf.* (1987), pp. 1424–1429.

*Primary Examiner*—Mark Chapman
*Attorney, Agent, or Firm*—Brian Dodson; George Libman

[57] ABSTRACT

A process for making high-efficiency solar cells. This is accomplished by forming a diffusion junction and a passivating oxide layer in a single high-temperature process step. The invention includes the class of solar cells made using this process, including high-efficiency solar cells made using Czochralski-grown silicon.

19 Claims, 5 Drawing Sheets

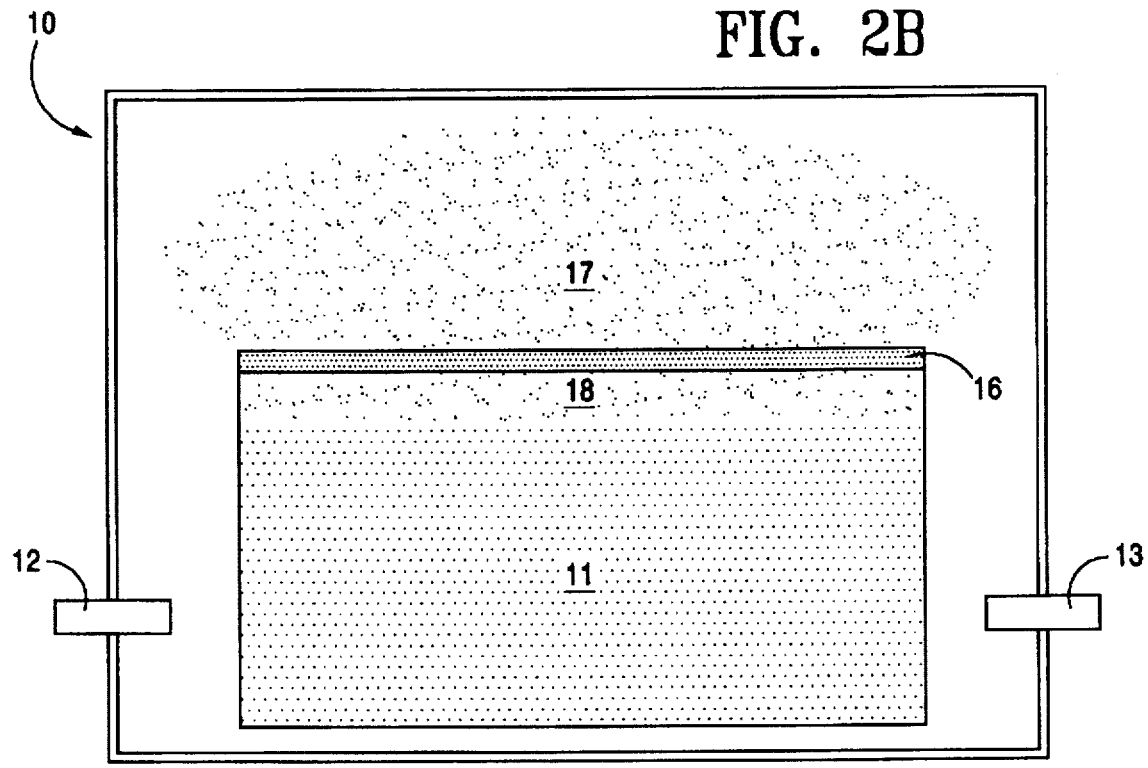
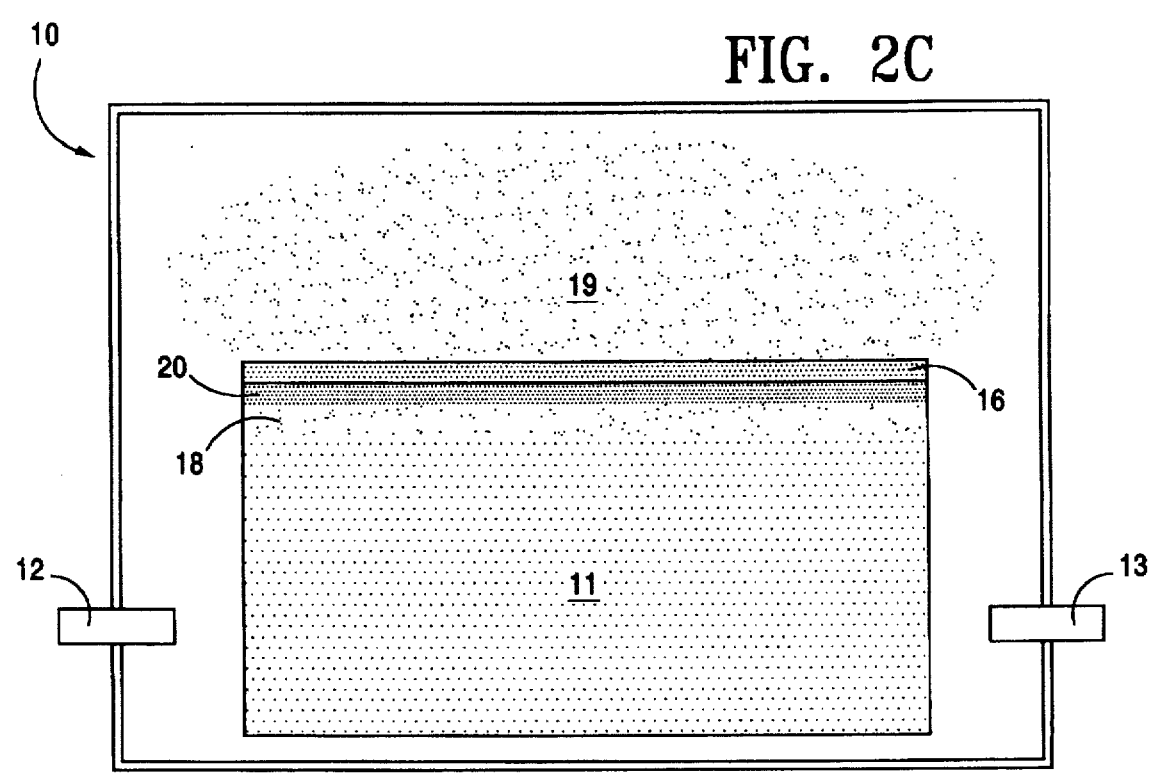

METHOD FOR FABRICATING SILICON CELLS

This application is a continuation of application Ser. No. 08/239,624, filed May 9, 1994, abandoned.

This invention was made with Government support under Contract DE-AC04-94DP85000 awarded by the U.S. Department of Energy. The Government has certain rights in the invention.

BACKGROUND

The discovery that light was able to generate a voltage was made by Becquerel in 1839, who experimented with a photoelectrochemical cell. The first true solar cells, i.e., solid-state devices that directly converted light into electricity, were made in the late 1800s in virtual ignorance of their principles of operation. In fact, the explanation of the photoelectric effect by Einstein in 1905 formed the ostensible basis for his being awarded the Nobel Prize in 1921, his Special and General theories of relativity being considered too controversial to acknowledge at that time. The first solid state photovoltaic cell, invented in 1876, was based on a platinum-selenium junction. These, and the cuprous oxide-copper cells which appeared shortly thereafter, remained a curiosity owing primarily to a very low conversion efficiency.

With the development of band theory in the 1930s and the resulting understanding of the band structure of semiconductors, the effect of dopant atoms, and the properties of metal-semiconductor junctions, it became clear that the now-conventional group of semiconductors (Si, Ge, GaAs, etc.) offered considerable promise for a new class of photoelectric generators. The first 'modern' solar cell, based on a pn junction in silicon, was developed in 1954, and exhibited a conversion efficiency of ~6%, representing a dramatic improvement over the earlier cells.

The rate of progress, however, was limited by at least two factors. First, a very limited market for such devices was foreseen because of their very high cost. Second, high conversion efficiency requires, among other things, a low rate of recombination of photo-excited carriers. This factor puts stringent requirements on the purity and crystalline perfection of the materials from which solar cells are made. For these and other reasons, solar cells were initially a low-priority novelty whose time had not quite come.

The first real applications for the solar cell began with the space race. The technical community was faced with the design of self-sufficient satellites weighing from a few pounds to a few tons. Given the enormous cost of launching such devices even into near-earth orbit, their power sources had to last longer than practical for batteries or fuel cells. Thermoelectric sources based on decay of highly-radioactive isotopes (usually Pu-238) were developed during this period, but proved impractical for most applications due to the enormous shielding requirements, not to mention the potential ecological consequences of a botched launch or uncontrolled reentry into the atmosphere. As a result, panels of solar cells which would provide power forever (or so it seemed) were almost always considered the optimal solution. Efficient solar cells have always been very expensive, but, given launch costs on the order of $100K/lb, construction expense is easily traded off against the lower launch weight resulting from higher efficiency. The needs of the space program thus drove rapid development of high-efficiency, although costly, solar cells from the late 1950s through the early 1970s. (The effect of the space program on solar cell research is still felt today.)

A number of economic and political forces emerged in the early 1970s that have had a profound effect on the goals of solar cell research. The Arab oil embargo emphasized the dangers of national dependence on a single major source of power. At the same time, public concerns about the safety of nuclear power were reaching an effective level, making further dependence on that source of power a political impracticality. This was also the general time frame in which general ecological concerns began to influence public policy, resulting in demands for reduced dependence on coal for electrical generation, and proposals for stringent limits on the degree to which hydroelectric power could be further developed. In essence, every significant power source in commercial use in the U.S. at that time was under attack.

One effect of the above conundrum was increased emphasis on development of 'alternate' energy sources. Many ideas were floated during this period, but the primary directions which emerged as having a reasonable chance of helping were conservation (fuel-efficient cars, insulation, etc.), new sources of biological fuels (e.g., alcohol), wind power, and solar power (thermal and photoelectric). A great deal of research and development has been invested in all these directions and their enabling technologies (e.g., storage of solar electricity for night use) since the 1970s, but only conservation has yet proven to have a significant effect on the nation's pattern of energy usage.

Considerable progress has been made in the last decade or so on the problem of practical conversion of sunlight to electricity, and the use of solar cells in remote and/or inconvenient locations has greatly increased. The cost of large-scale solar electricity generation as an adjunct to conventional sources (so that power storage costs do not have be included) is now projected to be about twice the average cost of conventional commercial sources, suggesting that the day of the solar cell is near. Conversion efficiencies have increased from the 6% of the early silicon solar cells to values approaching 40% in tandem stacked cells composed of a sandwich of solar cells of several different semiconductors, each of which convert a different portion of the sun's light to electricity. Another direction of research which may decrease capital costs is the development of concentrator solar cells. These concentrator cells work in tandem with an optical system that focuses incident sunlight onto the solar cell. The optical system can be rather inexpensive, generally based on Fresnel lenses or Winston-type nonimaging concentrators. Hence even a relatively expensive concentrator cell that can withstand, e.g., 100 suns combined with an appropriate optical system may cost less than an equivalent panel of conventional cells that has 100 times larger active area.

Current concentrator cells made of silicon operate easily at 100 suns and provide conversion efficiencies in the neighborhood of 20–25%. Silicon is chosen as a compromise between cost and conversion efficiency. A number of expedients known to those skilled in the art are utilized to obtain this level of conversion efficiency, including the use of antireflection coatings, texturization of the surface to reduce the reflectance of above-bandgap photons, prism covers to reduce shadowing by front-surface conductors, and physical structures that minimize recombination of photoexcited carriers. As a large number of designs produce similar efficiencies, and the present level of performance is not too far from the theoretical maximum performance for a silicon-based solar cell, further improvement in the overall cost of generation of solar electricity must either be based in the optical concentration system or in reducing the expense of manufacturing a design for a high-efficiency concentrator cell.

That there is room for improvement in the processing of high-efficiency concentrator cells is made clear by examining the processes through which those state-of-the-art cells having ~25% efficiency are produced. The current process streams for such designs include multiple dopant diffusions, many photolithography steps, and up to six high-temperature furnace steps. Such complexity leads naturally to an expensive process with low product yield. Process simplification seems more likely to produce dramatic reduction in real product cost than does further optimization of the individual steps. Finally, the large number of high-temperature processing steps precludes the use of low-cost Czochralski-grown silicon wafers, as this material is easily degraded by repeated cycling to high temperature (high-temperature in this case is in excess of 800° C.). As a result, no existing process for manufacture of high-efficiency (~20%) concentrator solar cells can utilize Czochralski-grown silicon. The use of expensive float-zone silicon crystals is thus required for the above-mentioned devices, leading again to an expensive product.

For the foregoing reasons, there is a need for a dramatically simplified process stream compatible with a high-efficiency concentrator solar cell design. This new process stream should not only reduce the complexity of manufacture, but should include no more than a single high-temperature furnace step, so that low-cost Czochralski silicon wafers can be used to minimize the cost of the ultimate product, thereby widening the realm of practical application of such devices.

SUMMARY

The present invention is directed to a fabrication process that addresses the aforementioned difficulties. This process comprises a novel technique to form a pn (np) junction covered by a passivating oxide layer, comprising creating a source of dopant atoms on the surface of a silicon wafer, diffusing these atoms into the wafer, and forming a passivating oxide layer in a single high-temperature (~900° C.) furnace step. Other improvements include simplification of the process stream for a PESC-type solar cell to require only three-photomask steps and, owing to the need for only one high-temperature step, the ability to use Czochralski silicon wafers with only a minor loss in conversion efficiency. This process is applied here to a PESC-type design, but can be applied to most solar cell designs, producing significant reduction in the cost of the finished device.

BRIEF DESCRIPTION OF THE DRAWINGS

FIGS. 2a–2c. Formation of a diffusion junction with an oxide passivation layer on a silicon wafer.

DESCRIPTION

Figure 1:
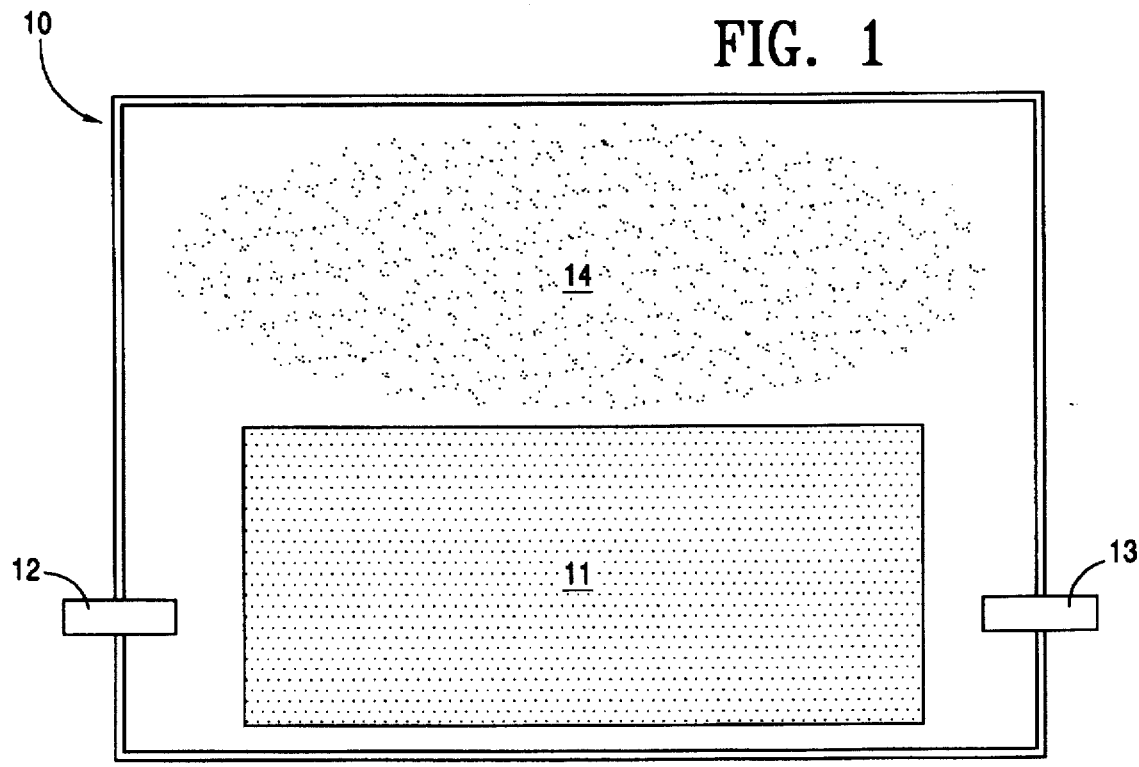
FIG. 1. Schematic of the high-temperature furnace used for forming a diffusion junction with an oxide passivation layer on a silicon wafer.

The crux of the present invention is a novel process to form, on a p-type (n-type) silicon wafer, a pn (np) junction covered by a passivating oxide layer in a single high temperature furnace step. The essential apparatus for this process is shown schematically in FIG. 1, and comprises a high-temperature furnace 10 capable of containing a doped single-crystalline silicon wafer 11 and a process atmosphere 14. The high-temperature furnace is equipped with means 12 to add gas to and means 13 to bleed gas from its interior, enabling the chemical composition of the process atmosphere to be changed as the process advances. Such furnaces are common tools in modern semiconductor fabrication lines.

Figure 2A:
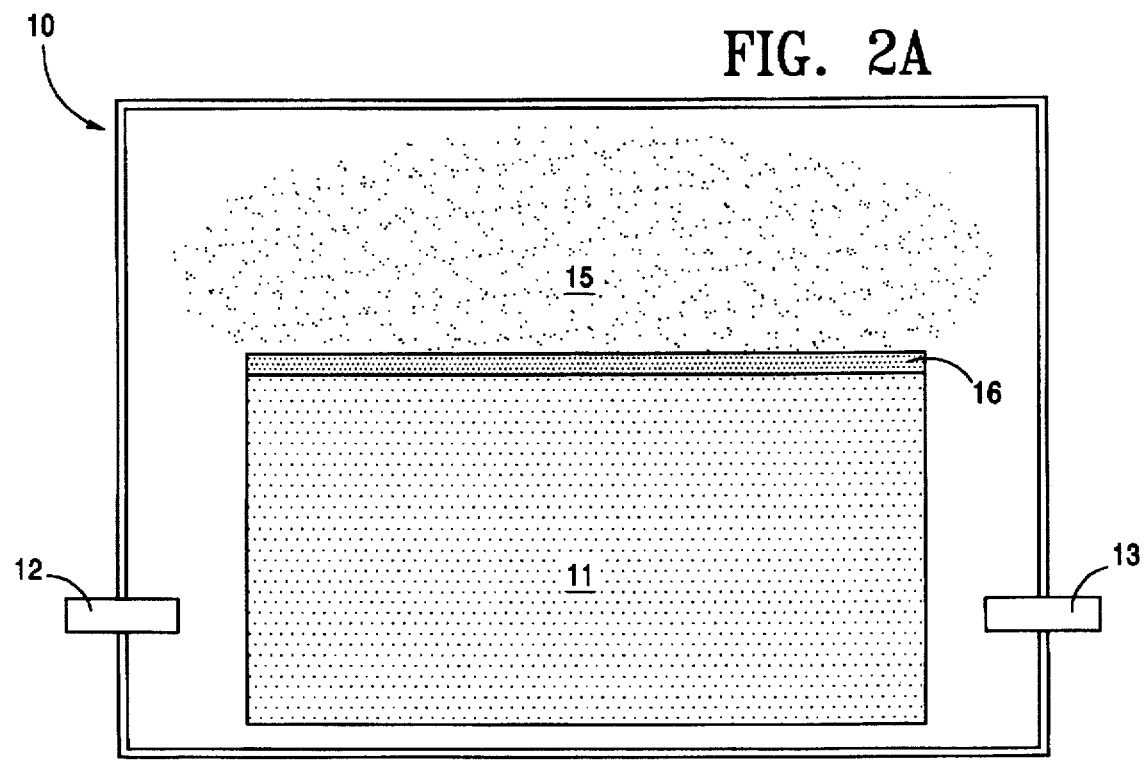

FIGS. 2a, b, and c illustrate the steps which take place to form a junction and an oxide passivation layer on a silicon wafer. All steps take place in the furnace introduced in FIG. 1. In FIG. 2a, the initial process atmosphere 14 has been replaced by a gaseous dopant source material 15, which comprises dopant atoms of opposite conductivity type to those originally existing in doped silicon wafer 11. (That is, if the wafer 11 is p-type, the dopant atoms in the source material 15 are n-type, and vice versa.) The gaseous dopant source material 15 reacts with the surface of doped silicon wafer 11, to form a thin layer of a dopant-silicon-oxide compound 16. (Note that it is also possible to directly deposit, prior to placing the wafer 11 into the high-temperature furnace 10, the layer 16 using suitable physical deposition means. Such means would include spin-on techniques, CVD deposition of the doped silicon glass, and ion implantation techniques.)

A large number of possible gaseous dopant source materials exist, including a mixture of a volatile dopant and oxygen, a volatile dopant-oxide compound, a mixture of a volatile dopant-oxide compound and additional oxygen, and a mixture of a dopant-containing compound and oxygen. Applicant's experimental work has been carried out with a p-type doped silicon wafer 11, and the dopant chosen to form the pn junction is phosphorous. The gaseous dopant source material 15 thus was chosen to comprise a mixture of $POCl_3$ and $O_2$. (In the demonstrations, this mixture is essentially an $O_2$ ambient containing on the order of 1% $POCl_3$.) At the furnace temperature of 850°–950° C., the reaction of these two compounds at the silicon surface results in deposition of a layer of $P_2O_5$. The $P_2O_5$ reacts with the silicon surface to form a phosphosilicate glass, of which layer 16 is comprised. An exposure period of 10 minutes is generally used. These details are illustrative in nature, and are not intended to limit the scope of the invention in any manner.

Following formation of the dopant-silicon-oxide compound 16, the process atmosphere is changed from the gaseous dopant source material 15 to an inert gas 17 (usually $N_2$ or Ar). The wafer 11 is then allowed to sit at high temperature for a period of time, during which the dopant atoms from the dopant-silicon-oxide compound 16 diffuse into the surface of the wafer, forming a layer 18 between 16 and 11, said layer having the opposite conductivity type of the doped silicon wafer 11. As a result, a pn (or up) junction is formed at the intersection of 11 and 18 as shown in FIG. 2b.

The diffusive step above is carried out until the layer 18 has penetrated the correct distance into the doped silicon wafer 11. This distance depends on the design of the desired solar cell, and can be controlled by proper choice of the furnace temperature and the time allowed for diffusion, as is well known to a person having ordinary skill in the art. In the present experimental studies, the inert gas 17 was $N_2$, and the diffusive step was carried out for some 1.25 minutes. This time can be varied to obtain a wide range of emitter sheet resistances, allowing application of this method to a wide range of possible devices.

Upon passage of the required period, the process atmosphere 14 is again changed, this time to an oxidizing atmosphere 19, as shown in FIG. 2c. The oxygen provided by the oxidizing atmosphere 19 does not react with the dopant-silicon-oxide compound layer 16, as that compound is already oxidized. Instead, the naturally open and (generally) defective structure of layer 16 allows oxygen to pass through layer 16, forming an oxide layer 20 between the dopant-silicon-oxide compound layer 16 and the layer 18. This has several effects. First, the dopant atoms do not diffuse through the oxide layer 20, as layer 20 grows faster than the dopants travel through it. As a result, formation and growth of the oxide layer 20 cuts off the supply of dopant atoms, hence limiting the extent of doping which occurs in layer 18. Second, the oxide layer 20 is in excellent contact with said layer 18, and is a high-temperature thermally grown oxide. It therefore exhibits excellent passivation properties. Finally, mere operation of a solar cell does not depend strongly on the ultimate thickness of the oxide layer 20. It can therefore be formed with a thickness suitable for action as an antireflection coating in the wavelengths to which a silicon-based device is most sensitive. An appropriate thickness for the combined passivating oxide layer and dopant-silicon-oxide layers for effective antireflection activity is about 110 nm.

The experimental studies showed that an oxidizing atmosphere 19 of 100% $O_2$ for a period of some 200 minutes successfully grows a 110 nm thick layer of passivating oxide and the dopant-silicon-oxide compound layer 16. (The actual thickness of the passivating oxide layer is perhaps half of this thickness.) Because of the high-temperature thermal growth of the oxide layer, the resulting surface is very well passivated, leading to high conversion efficiencies in properly designed solar cells. Again, the experimental details are only meant to be illustrative of the potential of this invention, and are not included with the intent of limiting the scope of the invention.

There are several reasons that this process is so important in developing an overall process for manufacturing cost-effective high-efficiency solar cells. The most obvious is that the fewer discrete operations required, the lower will be the cost of the final product. This is particularly true for multiple furnace operations, which require care in handling wafers being processed and time for thermal cycling. Note again that all three steps of the current process, the formation of the dopant-silicon-oxide compound layer 16, the diffusion step which produces the layer 18, and the oxidation step which forms the oxide layer 20, take place in a single furnace set at a single temperature, the process control resulting from control of the composition of and duration of exposure to the process atmosphere 14. This simplification greatly reduces both processing time and the set-up cost for the processing line.

In the case of high-efficiency solar cells, however, there is an additional payoff. One would like to make high-efficiency solar cells of Czochralski-grown silicon, owing to its easy availability and low cost. However, it is well-known that multiple exposure of Czochralski-grown silicon to conditions of high-temperature seriously degrades the material, filling it with recombination centers for photoexcited carriers and thus lowering the conversion efficiency of the resulting device. As a result, state-of-the-art devices are all built on float-zone grown silicon, a growth process which avoids the problems associated with multiple exposures to high-temperatures, but which greatly increases the cost of the wafer, while also limiting its dimensions.

Figure 3:
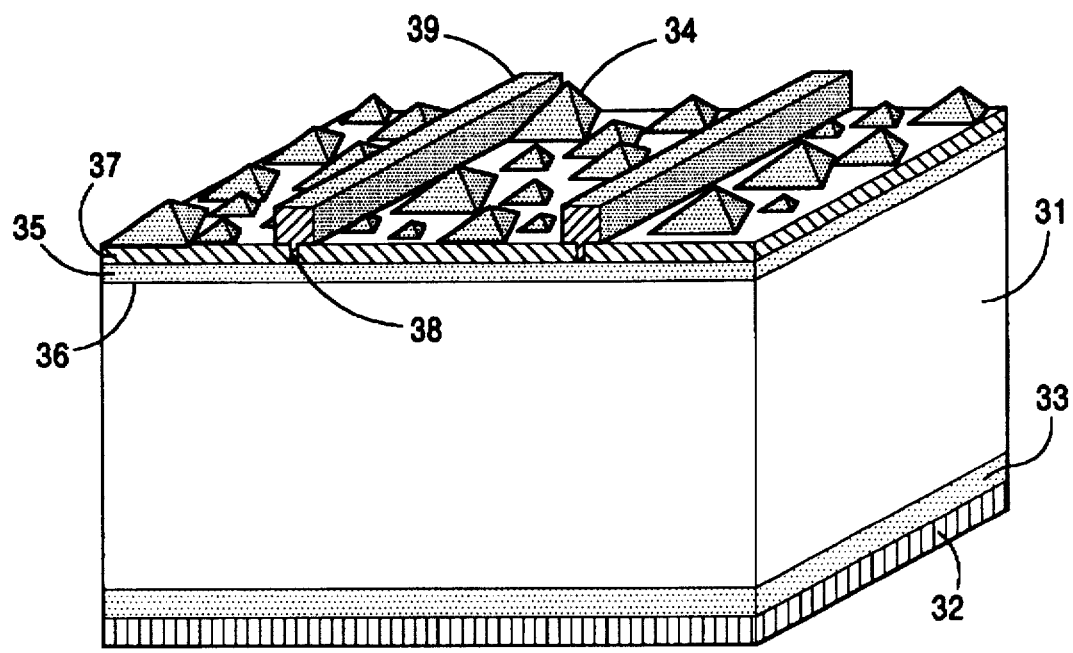
FIG. 3. Schematic of a PESC-type textured-surface solar cell.

Prior art for formation of a junction and a high-quality oxide passivation layer requires multiple high-temperature furnace exposures. As the present invention avoids this trap, it is reasonable to develop a complete process for manufacture of a high-efficiency solar cell in which only the one exposure to high-temperature is required, thus allowing use of the much cheaper Czochralski-grown silicon. Such a device is illustrated in FIG. 3. This device is closely related to the PESC-type solar cells, but the manufacturing process developed is based on Applicant's new technique for formation of junctions buried under a passivating oxide layer, and it is that process which is described in the claims. Those parts of the process which are specific to the present invention apply to a wide range of specific solar cell designs. A brief description of the principal features of this specific device, however, is useful for future reference.

FIG. 3 shows schematically a PESC-type solar cell manufactured using a process based on the present invention. It is based upon a p-type single-crystalline silicon wafer 31. On the back surface of wafer 31 a metallic back contact 32 is deposited. To insure ohmic contact with the wafer a low-temperature annealing step acts to diffuse a small amount of the metal into the wafer, forming a high-conductivity region 33 in intimate contact with both wafer 31 and metallic back contact 32. The front surface of wafer 31 is textured with a random collection of pyramids 34. These pyramids have dimensions in the micron-size range, and serve to reduce the reflectance of the solar cell without interfering with any process steps. After the pyramids 34 are formed, an n-doped layer 35, a pn junction 36 and a passivating oxide layer 37 are formed using the present invention as described above. Finally, gridline contact areas 38 are etched through the passivating oxide, and gridlines 39 are deposited to form electrical contact with the front surface. A final low-temperature annealing insures that the gridlines 39 make ohmic contact with the n-doped layer 35.

Figure 4A:
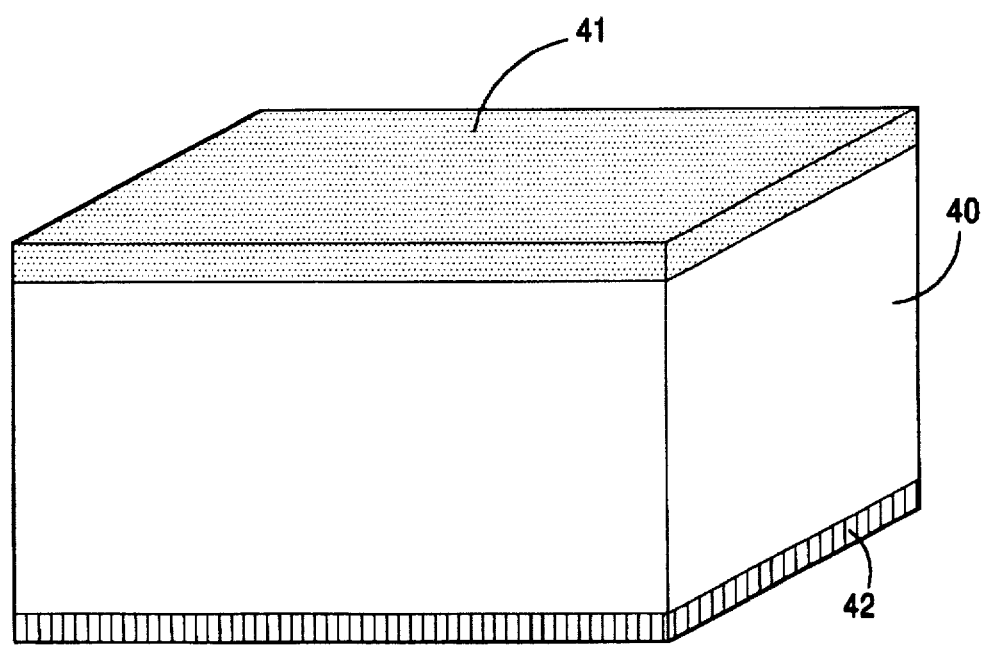
FIGS. 4a–4d. Stages in the process for manufacture of a PESC-type textured-surface solar cell using the present invention.

FIGS. 4a, b, c, and d illustrate the process flow for fabrication of a PESC-type textured-surface solar cell similar to that appearing in FIG. 3. (These figures are not to scale.) The choice of this specific design, the particular process steps indicated, and the order of said steps is not intended to limit the scope of the present invention, as many variations will be clear to a person having ordinary skill in the art. In particular, many processes to etch silicon or silicon-oxide are well-known, and thus etchants are not further described unless they possess an unusual property or goal. This description, however, will serve to clearly illustrate an embodiment of the present invention.

The result of the first sequence of steps is shown in FIG. 4a. Begin with a p-type (n-type) single-crystalline silicon wafer 40 having a front surface and a back surface.

a) Deposit Si-oxide layer 41 on the front surface of wafer 40 using a low-temperature process. The inventor's demonstration used a CVD process operating at 400° C., but other low-temperature processes are possible (e.g., vacuum evaporation).

b) Form a layer 42 comprising aluminum on the bottom surface of wafer 40. The demonstration used vacuum deposition of 0.5 μm of aluminum, but other techniques, materials, and thicknesses may be used.

c) Anneal wafer 40 at 800° C. in an oxygen atmosphere. This has the combined effect of alloying the layer 42 with the silicon on the back surface of wafer 40, and of densifying the Si-oxide layer 41. The exact details are not important, save that use of substantially higher annealing temperatures will diminish performance.

Figure 4B:
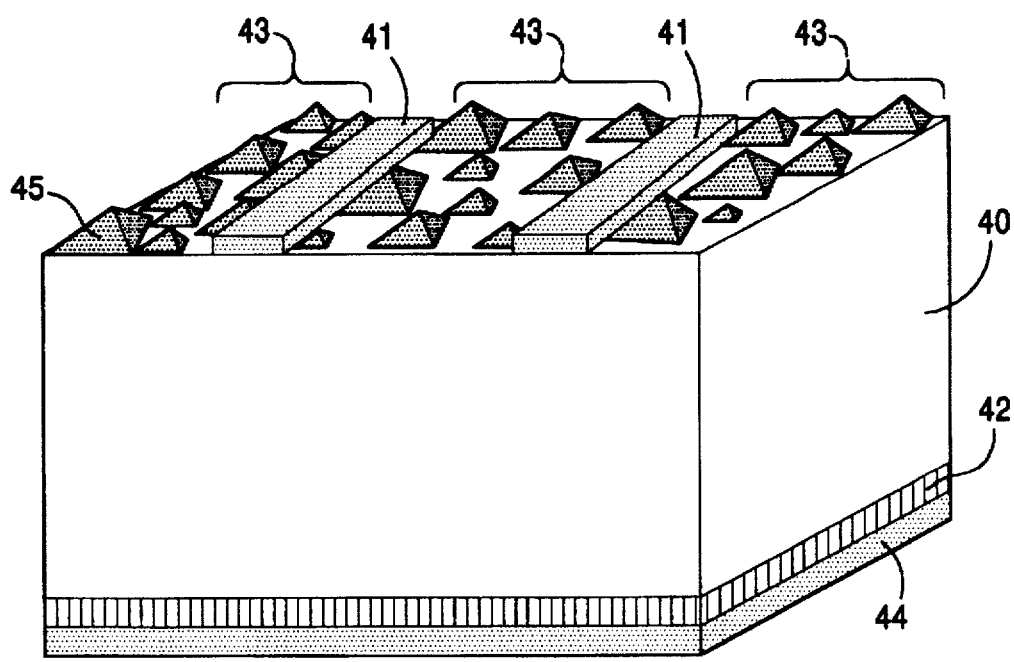

The result of the second sequence of steps appears in FIG. 4b. This takes the device through the texturing of the front surface of wafer 40.

d) Apply photoresist to top surface of wafer 40.

e) Expose through photomask and develop photoresist to define emitter areas 43.

f) Etch the oxide layer 41 from the emitter areas 43.

g) Deposit Si-oxide 44 on back surface of wafer 40 using a low-temperature process, thus covering and protecting the metal layer 42. Again, the demonstration used a CVD process operating at 400° C., but the invention is not intended to be limited to that deposition technique.

h) Texture the front surface of wafer 40. The demonstration applied an anisotropic etch to obtain a random distribution of pyramids 45 having suitable dimensions to reduce surface reflectance from the emitter areas. This anisotropic etch consisted of a solution of, by volume, 125 parts of water, 5 parts of isopropyl alcohol, and 2 parts of a saturated aqueous solution of potassium hydroxide. Etching took place by immersion in the etchant mixture at a temperature of 70° C. for a period of roughly 15 minutes. Many other approaches toward reduction of surface reflection, however, are known in the art.

i) Etch the wafer 40 to round the points and edges of the pyramids 45. This is done to reduce stress concentrations, which would degrade device performance.

Figure 4C:
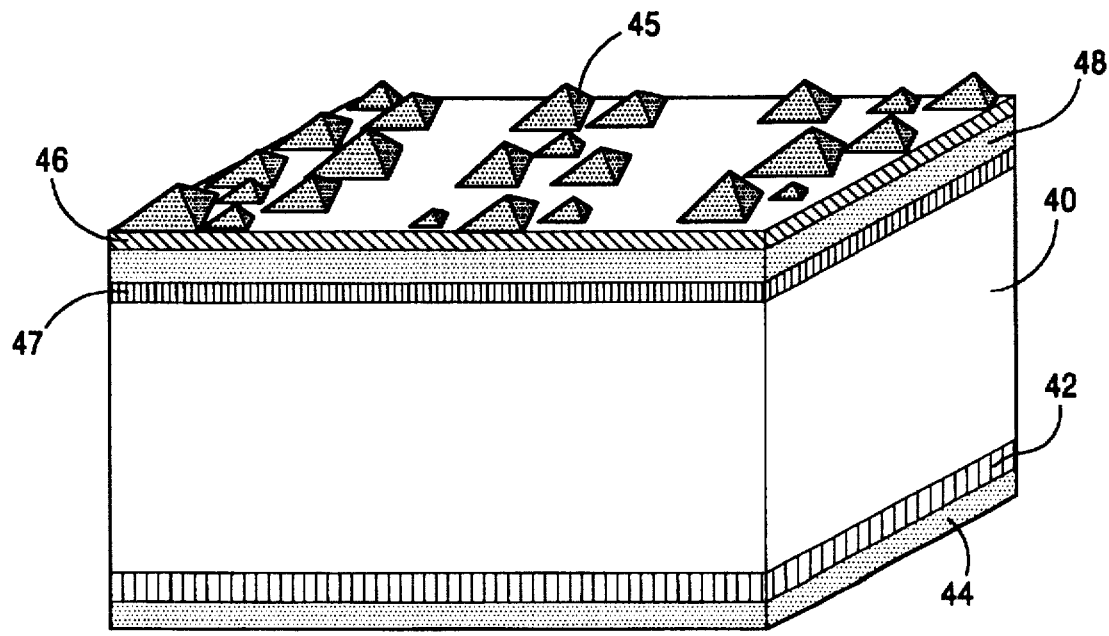

The third sequence of steps forms the pn (np) junction and the passivating oxide layer, shown in FIG. 4c, using the invention described in FIG. 2 and the accompanying discussion.

j) Place wafer 40 in a controlled-atmosphere high-temperature furnace. In the demonstration a temperature of 900° C. was used.

k) Introduce a gaseous n-type (p-type) dopant source material into the furnace. This material reacts with the front surface of the wafer 40, producing a dopant-silicon-oxide compound layer 46. The demonstration used a mixture of $POCl_3$ and $O_2$ for a period of 10 minutes.

l) Fill the furnace with an inert gas ($N_2$ was used in the demonstration).

m) Form an n-type (p-type) layer 47 by diffusing the dopant from layer 46 into the wafer 40. A nominal period of 1.25 minutes was used in the demonstration, but varying this period allows control of the emitter sheet resistance, an important design parameter for solar cells.

n) Fill the furnace with an oxidizing atmosphere ($O_2$ was used in the demonstration).

o) Form a passivating oxide layer 48 by subsurface oxidation between layer 46 and layer 47. In the demonstration a period of 200 minutes was used to grow an oxide layer such that the total thickness of layer 46 and 47 is ~110 nm in thickness. The combined layers are then effective as an antireflection coating.

Figure 4D:
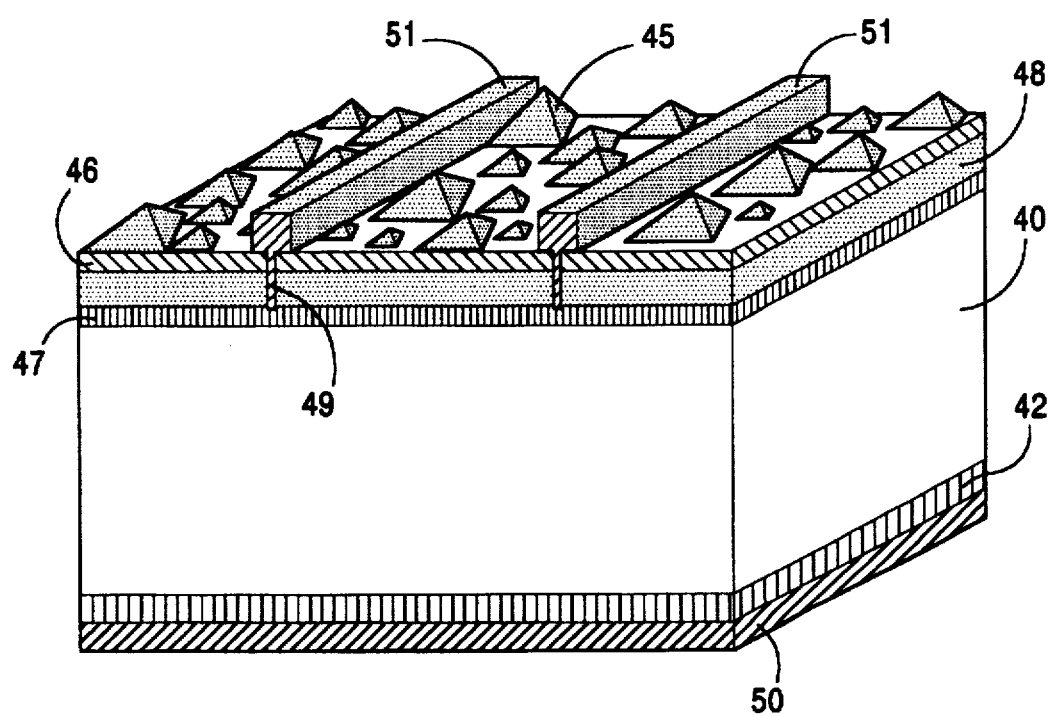

FIG. 4d shows the final structure, obtained through the following additional process steps.

p) Apply photoresist to top of wafer 40.

q) Expose through photomask and develop to define gridline contact areas 49. In the demonstration these were lines ~4 μm wide, but can be a pattern of patches rather than lines.

r) Etch gridline contact areas 49 through the passivating oxide layer 48.

s) Apply photoresist to top of wafer 40.

t) Expose through photomask and develop to define metal pattern for gridlines 51. In the demonstration this photomask was simply the reversed image of that used in step r.

u) Deposit metal 50 on back of wafer 40. In the demonstration this is a 1 μm layer of aluminum, but any metal known in the art to make an ohmic contact may be used.

v) Deposit metallic gridlines 51 on front of wafer 40. In the demonstration a trilayer of Ti/Pd/Ag with thicknesses 100 nm/50 nm/6 μm was used, but again this can be any metal or combination of metals known to make ohmic contact to doped silicon.

w) Dissolve the photoresist in acetone or equivalent solvent, so metal not on gridlines lifts off freely.

x) Anneal wafer 40 at low-temperature in an inert gas atmosphere to sinter the electrical contacts 50 and 51. The demonstration used forming gas at 450° C., because this treatment is known to minimize the interface state density, but the process need not be so limited.

The above process is a specific embodiment of the present invention to a specific type of device, and the description is not intended to limit the claims or application of the invention to other devices. Note that the complete process has one high-temperature step and only three photolithography steps. This is a dramatic improvement over conventional processing, which may include as many as eight high-temperature furnace steps and six photolithography steps. Further, the performance of the demonstration devices is state-of-the-art, yielding a conversion efficiency above 22% up to a concentration of 100 suns for PESC-type solar cells built on float-zone grown silicon.

The great benefit of the present process, beyond mere simplification, is that it can be used to make high-efficiency devices on Czochralski-grown silicon. Demonstration cells grown on such material show a conversion efficiency of ~20% up to an illumination level of 100 suns, a considerable increase over the ~15% expected from prior art cells based on Czochralski-grown silicon. (One sun is defined as that illumination having spectral characteristics of sunlight at the Earth's surface when the sun is ~48° from overhead, and having an intensity of 1 $kW/m^2$.) The degree of improvement in this instance was unexpected, as it was unclear ab initio that the Czochralski-grown silicon could withstand prolonged exposure to ~900° C. without accumulating sufficient damage to reduce the conversion efficiency to conventional levels. Multicrystalline silicon, i.e., polycrystalline silicon having grain sizes in the mm to cm range, can also be processed in the above manner.

We claim:

1. A method for fabricating a junction between a silicon wafer doped with a first dopant species having a first electrical conductivity type and a silicon layer doped with a second dopant species having a second electrical conductivity type, comprising:

a) heating said silicon wafer at high temperature in a furnace;

b) forming a dopant-silicon oxide layer on a top surface of said silicon wafer, said dopant-silicon oxide layer comprising said second dopant species and oxygen;

c) filling the furnace with an inert gas atmosphere;

d) diffusing said second dopant species into the top surface of said silicon wafer to form said silicon layer doped with said second dopant species;

e) filling the furnace with an oxidizing atmosphere, and;

f) forming by subsurface oxidation an antireflecting and passivating surface oxide layer between said silicon layer and said dopant-silicon oxide layer.

2. A silicon concentrator solar cell exhibiting efficiency of ~20% at illumination levels above 20 suns made according to the process of claim 1, comprising:

a) a crystalline wafer of Czochralski-grown p-type silicon, top surface of said wafer possessing texturing patterns reducing reflectance of photons having energy greater than the Si bandgap;

b) a conducting layer on the bottom surface in ohmic contact with said wafer;

c) an n-doped silicon layer on top of said texturing-patterns on said top surface;

d) an oxide passivation layer on top of the n-doped silicon layer, said oxide passivation layer having a thickness of about 110 nm suitable to minimize cell reflectance and including narrow apertures allowing access to the doped silicon layer; and, e) metal electrodes filling said apertures and providing ohmic contact to the doped silicon layer.

3. The method of claim 1, wherein said first dopant species is n-type.

4. The method of claim 1, wherein said first dopant species is p-type.

5. The method of claim 1, wherein diffusing step d) is accomplished by heating said wafer.

6. The method of claim 1, wherein said silicon wafer is one of the group consisting of doped float-zone silicon, doped Czochralski silicon, or doped multicrystalline silicon.

7. The method of claim 1, wherein said dopant-silicon-oxide is formed by introducing a gaseous second dopant source material into said furnace.

8. The method of claim 7, wherein said gaseous second dopant source material is selected from the group consisting of gaseous mixtures of the second dopant and oxygen, a second dopant-oxygen compound and oxygen, and a second dopant-containing compound and oxygen.

9. The method of claim 7, wherein:

a) said silicon wafer is p-type;

b) said gaseous second depart source material comprises a gaseous mixture of $POCl_3$ and $O_2$;

c) said inert gas atmosphere comprises $N_2$, and;

d) said oxidizing atmosphere comprises $O_2$.

10. A semiconductor device comprising a junction and surface antireflecting and passivating oxide layer formed using the process of claim 1.

11. A method for fabricating a PESC-type concentrator solar cell from a crystalline silicon wafer, comprising:

a) forming a silicon-oxide layer on a top surface of the crystalline silicon wafer;

b) depositing a metal layer on a bottom surface of the crystalline silicon wafer;

c) annealing said crystalline silicon wafer in a furnace containing an oxygen atmosphere;

d) defining emitter areas on the top surface of said crystalline silicon wafer by forming openings in said silicon-oxide layer;

e) depositing a protective silicon-oxide layer on the metal layer on the bottom surface of the crystalline silicon wafer;

f) heating said crystalline silicon wafer at high temperature;

g) introducing a gaseous second dopant source material into the atmosphere of said furnace, where said gaseous second dopant source material comprises a second dopant of a second conductivity type, thereby forming a dopant-silicon-oxide layer on top of the crystalline silicon wafer;

h) filling said furnace with an inert gas atmosphere;

i) diffusing said second dopant into the emitter regions of said crystalline silicon wafer;

j) filling said furnace with an oxidizing atmosphere, thereby forming an antireflecting and passivating oxide layer below the dopant-silicon-oxide layer;

k) etching a pattern of gridline contact areas through said passivating oxide layer, and;

l) depositing conducting gridlines on said gridline contact areas.

12. The method of claim 11, wherein said crystalline silicon wafer is one of the group consisting of doped float-zone silicon, doped Czochralski silicon, or doped multicrystalline silicon.

13. The method of claim 11, wherein said gaseous second dopant source material is selected from the group consisting of gaseous mixtures of a second dopant and oxygen, a second dopant oxide and oxygen, and a second dopantcontaining compound and oxygen.

14. The method of claim 11, wherein:

a) said crystalline silicon wafer is p-type;

b) said second dopant source material comprises a gaseous mixture of $POCl_3$ and $O_2$;

c) said inert gas atmosphere consists essentially of $N_2$, and;

d) said oxidizing atmosphere consists essentially of $O_2$.

15. The method of claim 11, wherein said conducting gridlines are deposited by:

a) depositing a metal structure along the gridline contact areas, and;

b) annealing the crystalline silicon wafer at low-temperature.

16. A solar cell formed using the process of claim 11.

17. The method of claim 9, further comprising texturizing said emitter areas with structures having dimensions suitable to reduce the reflectance of above-bandgap photons incident on the emitter areas.

18. The method of claim 17, comprising said texturizing to be carried out through the action of an anisotropic silicon etchant.

19. The method of claim 17, comprising said texturizing to be carried out through photolithographic processing.

* * * * *